United States Patent
Cudak et al.

(10) Patent No.: US 10,425,768 B2
(45) Date of Patent: Sep. 24, 2019

(54) ADJUSTING AUDIO OUTPUT VOLUME BASED ON A DETECTED PRESENCE OF ANOTHER DEVICE

(71) Applicant: Lenovo (Singapore) Pte. Ltd., Singapore (SG)

(72) Inventors: Gary David Cudak, Wake Forest, NC (US); Nathan J. Peterson, Durham, NC (US); Amy Leigh Rose, Chapel Hill, NC (US); Jennifer Lee-Baron, Morrisville, NC (US); John Scott Crowe, Durham, NC (US); Bryan Loyd Young, Tualatin, OR (US)

(73) Assignee: Lenovo (Singapore) Pte. Ltd., Singapore (SG)

(*) Notice: Subject to any disclaimer, the term of this patent is extended or adjusted under 35 U.S.C. 154(b) by 53 days.

(21) Appl. No.: 14/871,363

(22) Filed: Sep. 30, 2015

(65) Prior Publication Data
US 2017/0093356 A1  Mar. 30, 2017

(51) Int. Cl.
*H03G 3/00* (2006.01)
*H04W 4/02* (2018.01)
*G06F 3/16* (2006.01)
*H04W 4/80* (2018.01)
*H03G 3/30* (2006.01)
*H03G 3/32* (2006.01)

(52) U.S. Cl.
CPC ............. *H04W 4/023* (2013.01); *G06F 3/165* (2013.01); *H03G 3/3005* (2013.01); *H03G 3/32* (2013.01); *H04W 4/80* (2018.02)

(58) Field of Classification Search
CPC .................. H03G 3/001; H03G 3/002
USPC ........................................... 381/107
See application file for complete search history.

(56) References Cited

U.S. PATENT DOCUMENTS

| | | | |
|---|---|---|---|
| 2006/0045280 A1* | 3/2006 | Boss .................. | G05B 15/02 381/58 |
| 2009/0068993 A1* | 3/2009 | Allen .................. | H04M 1/642 455/413 |
| 2010/0166225 A1* | 7/2010 | Watanabe ............. | H03G 3/32 381/107 |
| 2010/0216402 A1* | 8/2010 | Appleby ............... | H04L 67/18 455/41.3 |
| 2015/0264528 A1* | 9/2015 | Bell ................... | H04M 1/72572 455/456.3 |

FOREIGN PATENT DOCUMENTS

| | | |
|---|---|---|
| CN | 104007951 A | 8/2014 |
| CN | 104636110 A | 5/2015 |
| CN | 104898446 A | 9/2015 |

* cited by examiner

*Primary Examiner* — Katherine A Faley
(74) *Attorney, Agent, or Firm* — Ferenec & Associates LLC

(57) ABSTRACT

One embodiment provides a method, including: detecting, using a processor, a presence of a known device within a predetermined range; and adjusting, using the processor, an audio output volume based on the presence of the known device. Other aspects are described and claimed.

20 Claims, 3 Drawing Sheets

ADJUSTING AUDIO OUTPUT VOLUME BASED ON A DETECTED PRESENCE OF ANOTHER DEVICE

BACKGROUND

Electronic devices such as laptops, tablets, smart phones, television sets, audio and media players, etc. ("devices"), are used for a variety of reasons. Commonly, users employ such devices to produce audio, e.g., in connection with playing a song, watching a video, talking on the phone, etc.

It is typical for a user to employ more than one device at a time. It is also common for multiple users to employ their devices at the same time. This sometimes leads to a conflict in terms of audio output, i.e., the devices' audio outputs conflict or interfere with one another. This is notable, for example, when multiple devices provide audio output simultaneously to one or more users in a room.

BRIEF SUMMARY

In summary, one aspect provides a method, comprising: detecting, using a processor, a presence of a known device within a predetermined range; and adjusting, using the processor, an audio output volume based on the presence of the known device.

Another aspect provides a device, comprising: a processor; an audio output device operatively coupled to the processor; a memory device that stores instructions executable by the processor to: detect a presence of a known device within a predetermined range; and adjusting, using the processor, an audio output volume based on the presence of the known device.

A further aspect provides a product, comprising: a storage device having code stored therewith, the code being executable by a processor and comprising: code that detects a presence of a known device within a predetermined range; and code that adjusts an audio output volume based on the presence of the known device.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

Figure 1:
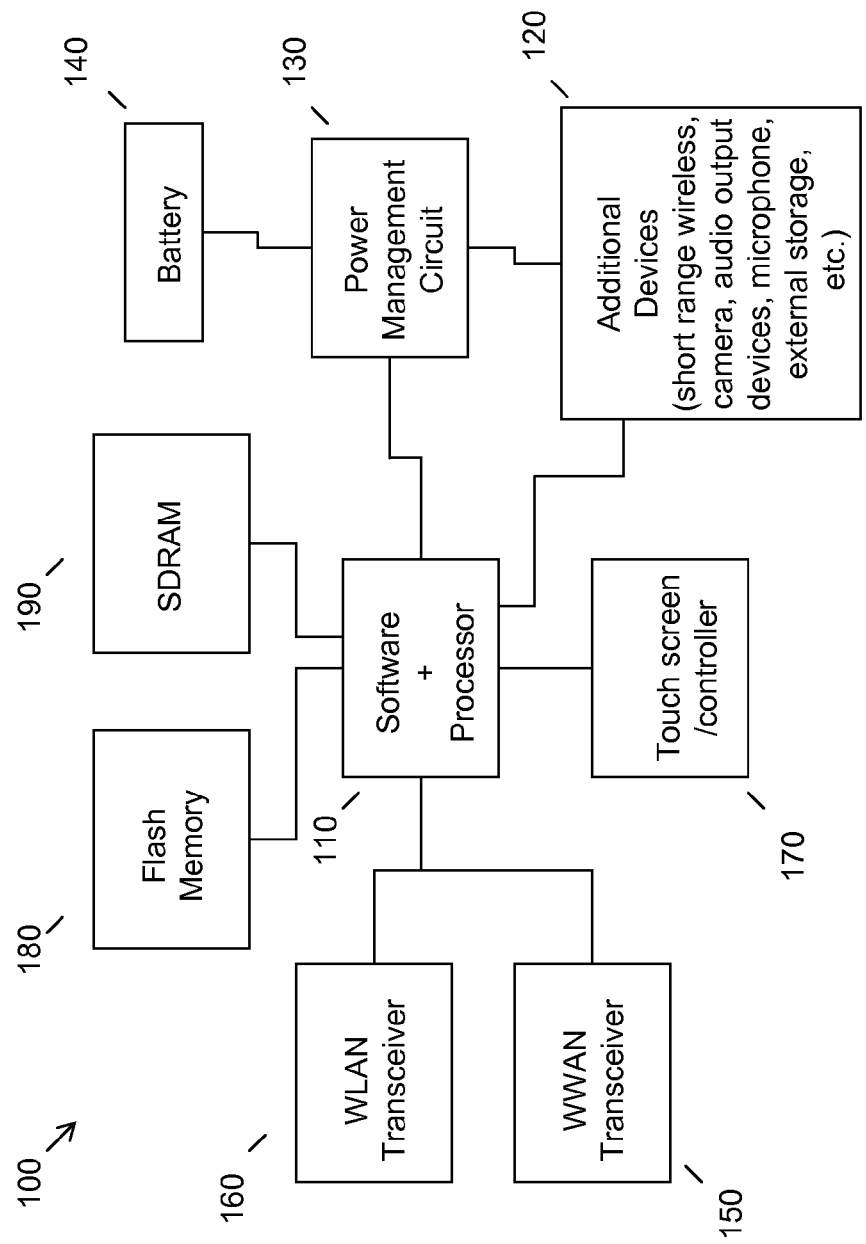
FIG. 1 illustrates an example of information handling device circuitry.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As above, user devices may produce conflicting audio output streams. For example, a first user may be watching television when another user enters the room using a smart phone voice call application on speaker phone mode. The audio produced by the television and the smart phone interfere with one another, forcing one or both users to adjust the television and smart phone audio outputs.

In an embodiment, a detection of a known device is made. For example, the smart phone in the above example may detect the presence of the television, e.g., via directly communicating with the television, e.g., via short range wireless communication or indirectly detecting the television, e.g., via a connection with a personal area network. When a known device, e.g., the television, is detected, an embodiment may adjust the volume of audio output on the basis of the detection. The adjustment to the audio output volume may be implemented on one or more devices, e.g., on just the smart phone, on just the television, on both of the television and the smart phone, etc. Also, different adjustments may be made (i.e., increase of audio output volume or decrease of audio output volume).

An embodiment may determine an audible range of the device(s) in detecting the presence of a known device. This compliments the ability to adjust audio output appropriately, i.e., such that conflicting audio is not produced or is removed/minimized based on which other device(s) are within audible range. For example, an audible range may be a predetermined range, e.g., determined based on the specifications of the device, the volume level of the device, the volume level of the content being accessed, etc. For example, a device may estimate its audible range based on the frequency of the audio output in combination with a volume level setting. An audio output of lower frequency may travel farther than a higher frequency output.

An embodiment may determine the context of the audio outputs of devices within the audible range. Devices may share context information with one another directly. Moreover, a central or intermediary device may facilitate communication between the devices outputting audio, e.g., a cloud device or personal area network device may share information with devices that are present within a given room.

Given the context of a device within a complex audio environment, i.e., an environment where more than one device is or will be producing audio output within the audible range, an embodiment may determine the importance or priority of a device, a user of the device, or of the audio output itself (e.g., content). This may be done a variety of ways, e.g., based on the context of the content relative to a user action. By way of example, an important user action that is given a higher priority than other actions may include a user selection dealing with audio output volume itself (e.g., increasing, decreasing or muting audio). Such associated user action may be used to determine that a particular audio stream is or is not a priority audio output.

Based on the context of use, the content, the priority of particular devices, users, or audio output contents, an embodiment may thereafter adjust the volume of audio output of one or more devices. Thus, an embodiment may automatically lower the audio output of a given device, may increase the audio output of a given device, or a combination of the foregoing. An embodiment may provide a user a notice or a query for a user confirmation of a proposed action prior to implementing an automated management of the audio output(s).

The illustrated example embodiments will be best understood by reference to the figures. The following description is intended only by way of example, and simply illustrates certain example embodiments.

While various other circuits, circuitry or components may be utilized in information handling devices, with regard to smart phone and/or tablet circuitry 100, an example illustrated in FIG. 1 includes a system on a chip design found for example in tablet or other mobile computing platforms. Software and processor(s) are combined in a single chip 110. Processors comprise internal arithmetic units, registers, cache memory, busses, I/O ports, etc., as is well known in the art. Internal busses and the like depend on different vendors, but essentially all the peripheral devices (120) may attach to a single chip 110. The circuitry 100 combines the processor, memory control, and I/O controller hub all into a single chip 110. Also, systems 100 of this type do not typically use SATA or PCI or LPC. Common interfaces, for example, include SDIO and I2C.

There are power management chip(s) 130, e.g., a battery management unit, BMU, which manage power as supplied, for example, via a rechargeable battery 140, which may be recharged by a connection to a power source (not shown). In at least one design, a single chip, such as 110, is used to supply BIOS like functionality and DRAM memory.

System 100 typically includes one or more of a WWAN transceiver 150 and a WLAN transceiver 160 for connecting to various networks, such as telecommunications networks and wireless Internet devices, e.g., access points. Additionally, devices 120 are commonly included, e.g., an audio output device such as a speaker that outputs sound converted from electrical signals, as further described herein. System 100 often includes a touch screen 170 for data input and display/rendering. System 100 also typically includes various memory devices, for example flash memory 180 and SDRAM 190.

Figure 2:
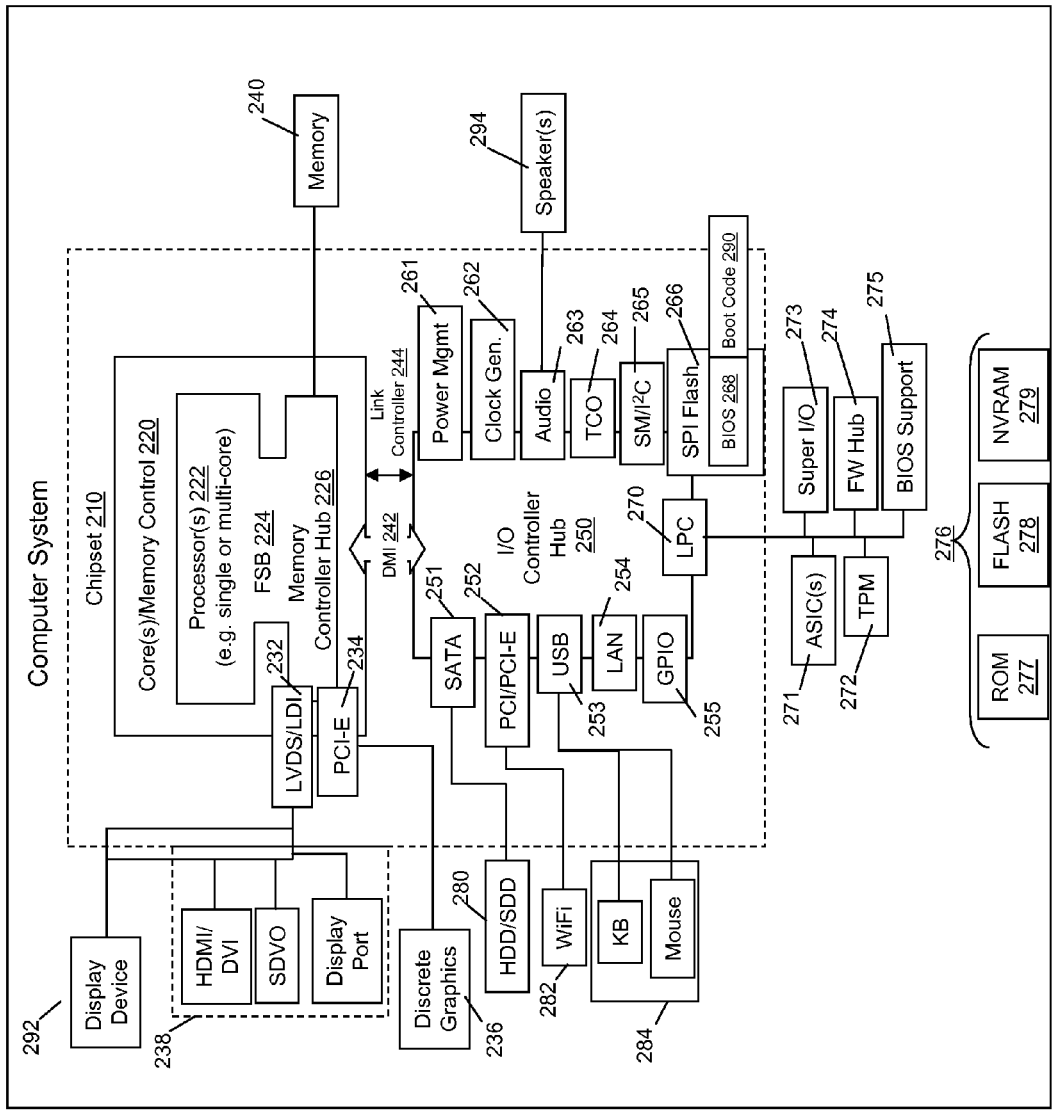
FIG. 2 illustrates another example of information handling device circuitry.

FIG. 2 depicts a block diagram of another example of information handling device circuits, circuitry or components. The example depicted in FIG. 2 may correspond to computing systems such as the THINKPAD series of personal computers sold by Lenovo (US) Inc. of Morrisville, N.C., or other devices. As is apparent from the description herein, embodiments may include other features or only some of the features of the example illustrated in FIG. 2.

The example of FIG. 2 includes a so-called chipset 210 (a group of integrated circuits, or chips, that work together, chipsets) with an architecture that may vary depending on manufacturer (for example, INTEL, AMD, ARM, etc.). INTEL is a registered trademark of Intel Corporation in the United States and other countries. AMD is a registered trademark of Advanced Micro Devices, Inc. in the United States and other countries. ARM is an unregistered trademark of ARM Holdings plc in the United States and other countries. The architecture of the chipset 210 includes a core and memory control group 220 and an I/O controller hub 250 that exchanges information (for example, data, signals, commands, etc.) via a direct management interface (DMI) 242 or a link controller 244. In FIG. 2, the DMI 242 is a chip-to-chip interface (sometimes referred to as being a link between a "northbridge" and a "southbridge"). The core and memory control group 220 include one or more processors 222 (for example, single or multi-core) and a memory controller hub 226 that exchange information via a front side bus (FSB) 224; noting that components of the group 220 may be integrated in a chip that supplants the conventional "northbridge" style architecture. One or more processors 222 comprise internal arithmetic units, registers, cache memory, busses, I/O ports, etc., as is well known in the art.

In FIG. 2, the memory controller hub 226 interfaces with memory 240 (for example, to provide support for a type of RAM that may be referred to as "system memory" or "memory"). The memory controller hub 226 further includes a low voltage differential signaling (LVDS) interface 232 for a display device 292 (for example, a CRT, a flat panel, touch screen, etc.). A block 238 includes some technologies that may be supported via the LVDS interface 232 (for example, serial digital video, HDMI/DVI, display port). The memory controller hub 226 also includes a PCI-express interface (PCI-E) 234 that may support discrete graphics 236.

In FIG. 2, the I/O hub controller 250 includes a SATA interface 251 (for example, for HDDs, SDDs, etc., 280), a PCI-E interface 252 (for example, for wireless connections 282), a USB interface 253 (for example, for devices 284 such as a digitizer, keyboard, mice, cameras, phones, microphones, storage, other connected devices, etc.), a network interface 254 (for example, LAN), a GPIO interface 255, a LPC interface 270 (for ASICs 271, a TPM 272, a super I/O 273, a firmware hub 274, BIOS support 275 as well as various types of memory 276 such as ROM 277, Flash 278, and NVRAM 279), a power management interface 261, a clock generator interface 262, an audio interface 263 (for example, for speakers 294), a TCO interface 264, a system management bus interface 265, and SPI Flash 266, which can include BIOS 268 and boot code 290. The I/O hub controller 250 may include gigabit Ethernet support.

The system, upon power on, may be configured to execute boot code 290 for the BIOS 268, as stored within the SPI Flash 266, and thereafter processes data under the control of one or more operating systems and application software (for example, stored in system memory 240). An operating system may be stored in any of a variety of locations and accessed, for example, according to instructions of the BIOS 268. As described herein, a device may include fewer or more features than shown in the system of FIG. 2.

Information handling device circuitry, as for example outlined in FIG. 1 or FIG. 2, may be used in devices such as tablets, smart phones, personal computer devices generally, and/or electronic devices that users may to use to produce audio outputs, for example associated with consuming media files, using voice call applications, producing device notifications (such as alarm clocks, ring tone or chimes used to indicate incoming communications such as emails, text messages and the like), etc. Specifically, an embodiment may be implemented as a device application running on one or more of a user's personal electronic devices.

Figure 3:
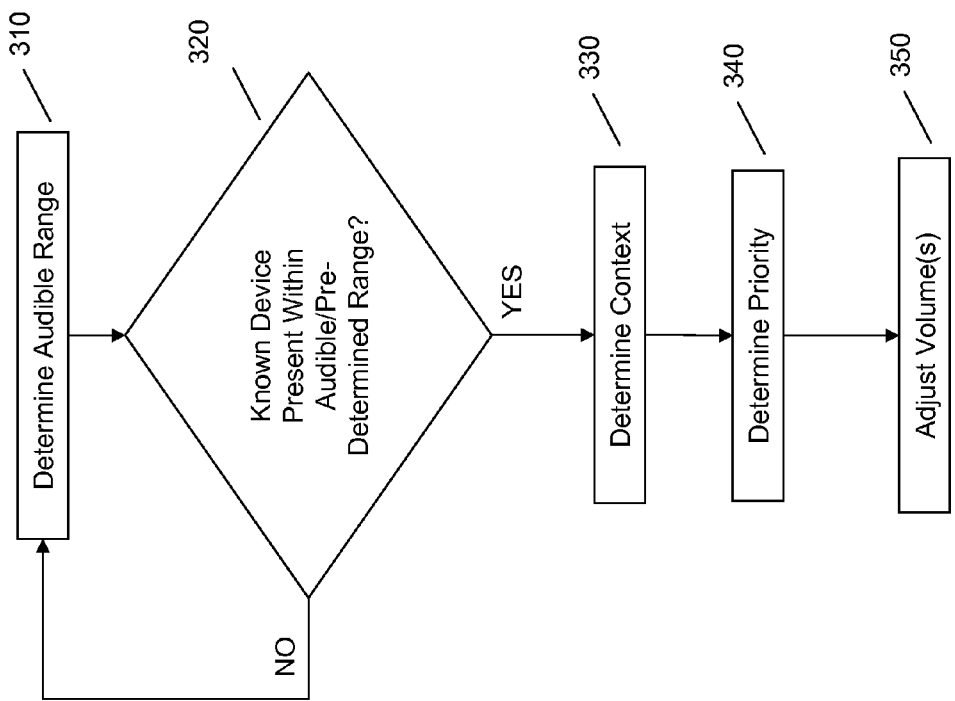
FIG. 3 illustrates an example method of adapting audio output based on context.

Referring to FIG. 3, a device may determine, at 310, its audible range and/or the audible range of surrounding device(s). The audible range may be determined by default, e.g., set according to specifications of the device or a sub-system or component thereof (e.g., speaker specifications). The audible range may be determined automatically in a dynamic fashion, e.g., using operative settings information such as volume level or the type (e.g., frequency) of the content currently being played. This information may then be converted into an audible range. A combination of specifications and setting information may be utilized to determine the audible range of the device. While not explicitly illustrated, the audible range calculated or otherwise set or determined for or by a device may be shared with other devices, e.g., within the calculated audible range, within a listing of personal devices, etc., such that the devices are aware of one another's audible ranges. In an embodiment, the audible range may be inferred, e.g., as inclusive of devices within a short range network such as connected via BLUETOOTH communication.

At 320 an embodiment may determine if a known device (e.g., another user device within a personal area network) is within audible range. For example, a user's smart phone may detect the presence of the user's television set, e.g., via short range wireless communication directly between the smart phone and the television set. Alternatively, the smart phone may detect the presence of the television via communication with an intermediary device, e.g., the user's laptop or a remote device, such as a cloud server.

An embodiment may determine, at 330 and based on the devices within the audible range, a context of the audio output stream(s) of the devices within that range. By way of example, devices may share context information with one another, e.g., regarding their location, their priority (as devices), the priority of their audio outputs (based on the content thereof), etc. Devices may share such information directly or may share this information via an intermediary or managing device.

Illustrated at 340, an embodiment may determine the importance or priority of a given audio output within the audible range. By way of example, the importance of the device, the content (e.g., content type, such as work, casual conversation, movie or television program, etc.), the associated function (e.g., alarm clock versus streaming radio program), or a user associated with the device may be determined. Thus, a device operating an alarm clock function or timer function for audio output may be prioritized over a device streaming a television or radio program. Likewise, a particular user device, e.g., a television set, may be prioritized over another user device, e.g., a child's media player or tablet. Based on the relative priority, one or more of the audio streams may be adjusted at 350.

An embodiment employs context in intelligently managing the volume of device audio outputs automatically. An embodiment may link certain functions with a priority setting (e.g., high priority) such that they do not have their volumes adjusted downward. For example, initiating or receiving a phone call, actions related to adjusting the volume manually, other manual user actions (e.g., changing a television channel), initiating new content playback on a device, etc., may be given a higher priority or ranking than other audio outputs, e.g., existing media playback on another device. An embodiment may also use other information to infer the context, priority, and appropriate adjustments. For example, an embodiment may determine context based on a relative or absolute values, e.g., a user or manufacturer may set priority for devices such that incoming phone calls are prioritized in terms of audio output over television or music playback. Likewise, users may set priorities of devices. Priorities or rankings may be employed in a variety of ways, for example ranking users, content and/or devices in terms of audio output. By way of example, parents' devices may be prioritized over or ranked higher than children's devices, or vice versa, certain content types may be prioritized over or ranked higher than others, e.g., movies ranked higher than cartoons, etc. A multi-factor analysis may be employed, e.g., taking into account a device ranking and a content type ranking.

An embodiment may adjust the volume(s) of the audio output(s) automatically at 350. The adjustment may be a locally implemented adjustment, i.e., a device may adjust its own volume up or down, depending on the other device(s) known to be within audible range, their priorities, etc. An adjustment to the volume may also be implemented remotely, e.g., a device may issue an instruction to another device (either directly or indirectly) to adjust that other device's volume. Similarly, a master device may issue instructions to some or all of the devices within the audible range.

An embodiment uses an importance determination at 340 to implement the adjustment at 350. The adjustment may include muting the volume, reducing the volume, or increasing the volume. The adjustment may take into account the device's audible range, e.g., reducing the volume to a level that takes the device out of the audible range with respect to another device (e.g., a higher priority device). Moreover, the adjustment may be incremental or dynamic, e.g., adjusted more than once, such as when another device changes its volume of audio output, as the device enters and/or leaves the audible range, etc. The determination of whether to adjust the volume of a given device may also depend on the output channel utilized by the device, e.g., a device outputting audio to a headset may not be subjected to automated volume adjustment.

The adjusted volume may be implemented automatically; however, this is not a requirement. In an embodiment, a notification may be provided to the user of the device such that the user is aware that a volume adjustment (for the user's device or another device) is recommended. For example, an embodiment may provide the user with an option, e.g., to answer a call and mute all other devices within audible range. As with other audio adjustments, this may be temporary, e.g., linked in time with the ongoing voice call, the device's presence within the audible range, etc.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

It should be noted that the various functions described herein may be implemented using instructions stored on a device readable storage medium such as a non-signal storage device that are executed by a processor. A storage device may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a storage device is not a signal and "non-transitory" includes all media except signal media.

Program code embodied on a storage medium may be transmitted using any appropriate medium, including but not limited to wireless, wireline, optical fiber cable, RF, et cetera, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

Example embodiments are described herein with reference to the figures, which illustrate example methods, devices and program products according to various example embodiments. It will be understood that the actions and functionality may be implemented at least in part by program instructions. These program instructions may be provided to a processor of a device, a special purpose information handling device, or other programmable data processing device to produce a machine, such that the instructions, which execute via a processor of the device implement the functions/acts specified.

It is worth noting that while specific blocks are used in the figures, and a particular ordering of blocks has been illustrated, these are non-limiting examples. In certain contexts, two or more blocks may be combined, a block may be split into two or more blocks, or certain blocks may be re-ordered or re-organized as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

The invention claimed is:

1. A method, comprising:
   detecting, at an information handling device, a presence of at least one known device within a predetermined range;
   receiving, at the information handling device, a current output volume setting of the at least one known device;
   determining, using a processor and based on a current output volume setting of the information handling device and the at least one known device, an output audible range for each of: the information handling device and the at least one known device;
   automatically identifying, based on the determining, whether there is an overlap in the output audible range of the information handling device and the output audible range of the at least one known device; and
   adjusting, responsive to determining the overlap in the output audible ranges and prior to emitting audio from the information handling device and receiving audio from the at least one known device, an audio output volume of at least one of the information handling device and the at least one known device based upon a priority setting.

2. The method of claim 1, wherein the detecting comprises detecting the at least one known device via a personal area network.

3. The method of claim 1, wherein the detecting comprises detecting the at least one known device via short range wireless communication.

4. The method of claim 1, wherein the detecting comprises receiving a priority indication.

5. The method of claim 4, wherein the adjusting comprises determining if the priority indication dictates a lower volume.

6. The method of claim 5, wherein the adjusting comprises lowering the audio output volume.

7. The method of claim 1, wherein the adjusting comprises issuing an instruction to the at least one known device.

8. The method of claim 1, wherein the audio output volume is adjusted locally.

9. The method of claim 1, further comprising determining a content type;
   wherein the adjusting comprises adjusting the audio output volume based on the presence of the known device and the content type.

10. The method of claim 9, wherein the content type is derived from content analysis.

11. A device, comprising:
    a processor;
    an audio output device operatively coupled to the processor;
    a memory device that stores instructions executable by the processor to:
    detect, using the device, a presence of at least one known device within a predetermined range;
    receive a current output volume setting of the at least one known device;
    determine, based on a current output volume setting of the device and the at least one known device, an output audible range for each of: the device and the at least one known device;
    automatically identify, based on the determining, whether there is an overlap in the output audible range of the device and the output audible range of the at least one known device; and
    adjust, responsive to determining the overlap in the output audible ranges and prior to emitting audio from the information handling device and receiving audio from the at least one known device, an audio output volume of at least one of the device and the at least one known device based upon a priority setting.

12. The device of claim 11, wherein to detect comprises detecting the at least one known device via a personal area network.

13. The device of claim 11, wherein to detect comprises detecting the at least one known device via short range wireless communication.

14. The device of claim 11, wherein to detect comprises receiving a priority indication.

15. The device of claim 14, wherein to adjust comprises determining if the priority indication dictates a lower volume.

16. The device of claim 15, wherein to adjust comprises lowering the audio output volume.

17. The device of claim 11, wherein to adjust comprises issuing an instruction to the at least one known device.

18. The device of claim 11, wherein the instructions are executable by the processor to determine a content type; and
    wherein to adjust comprises adjusting the audio output volume based on the presence of the known device and the content type.

19. The device of claim 18, wherein the content type is derived from content analysis.

20. A product, comprising:
    a storage device having code stored therewith, the code being executable by a processor and comprising:
    code that detects a presence of at least one known device within a predetermined range of the product;
    code that receives a current output volume setting of the at least one known device;
    code that determines, based on a current output volume setting of the product and the at least one known device, an output audible range for each of: the product and the at least one known device;
    code that automatically identifies, based on the code that determines and prior to emitting audio from the information handling device and receiving audio from the at least one known device, whether there is an overlap in the output audible range of the product and the output audible range of the at least one known device; and
    code that adjusts, responsive to determining the overlap in the output audible ranges, an audio output volume of at least one of the product and the at least one known device based upon a priority setting.

* * * * *